United States Patent
GrosJean

[11] 3,959,736
[45] May 25, 1976

[54] LOUDSPEAKER PROTECTION CIRCUIT

[75] Inventor: Jon Paul GrosJean, Batavia, N.Y.

[73] Assignee: GTE Sylvania Incorporated, Stamford, Conn.

[22] Filed: June 16, 1975

[21] Appl. No.: 587,039

[52] U.S. Cl. .......................... 330/207 P; 179/1 A; 179/1 SW
[51] Int. Cl.² ........................................ H03F 21/00
[58] Field of Search ............ 330/207 P; 307/202 R; 317/40 R; 179/1 A, 1 SW

[56] References Cited
UNITED STATES PATENTS
3,512,097   5/1970   Tyler.............................. 307/202 X

*Primary Examiner*—James B. Mullins
*Attorney, Agent, or Firm*—Norman J. O'Malley; Thomas H. Buffton; Robert T. Orner

[57] ABSTRACT

A power amplifier and loudspeaker protection circuit for a receiver having an AC potential source with a center-tap transformer shunted by a full-wave bridge rectifier and a power amplifier directly coupled to a loudspeaker connected to a potential reference level includes a thermal relay means coupling the bridge rectifier through normally closed contacts to a power amplifier stage and an impedance coupling the transformer center-tap to a potential reference level to activate the thermal relay means and disconnect the potential source in response to increased current flow in a loudspeaker.

7 Claims, 1 Drawing Figure

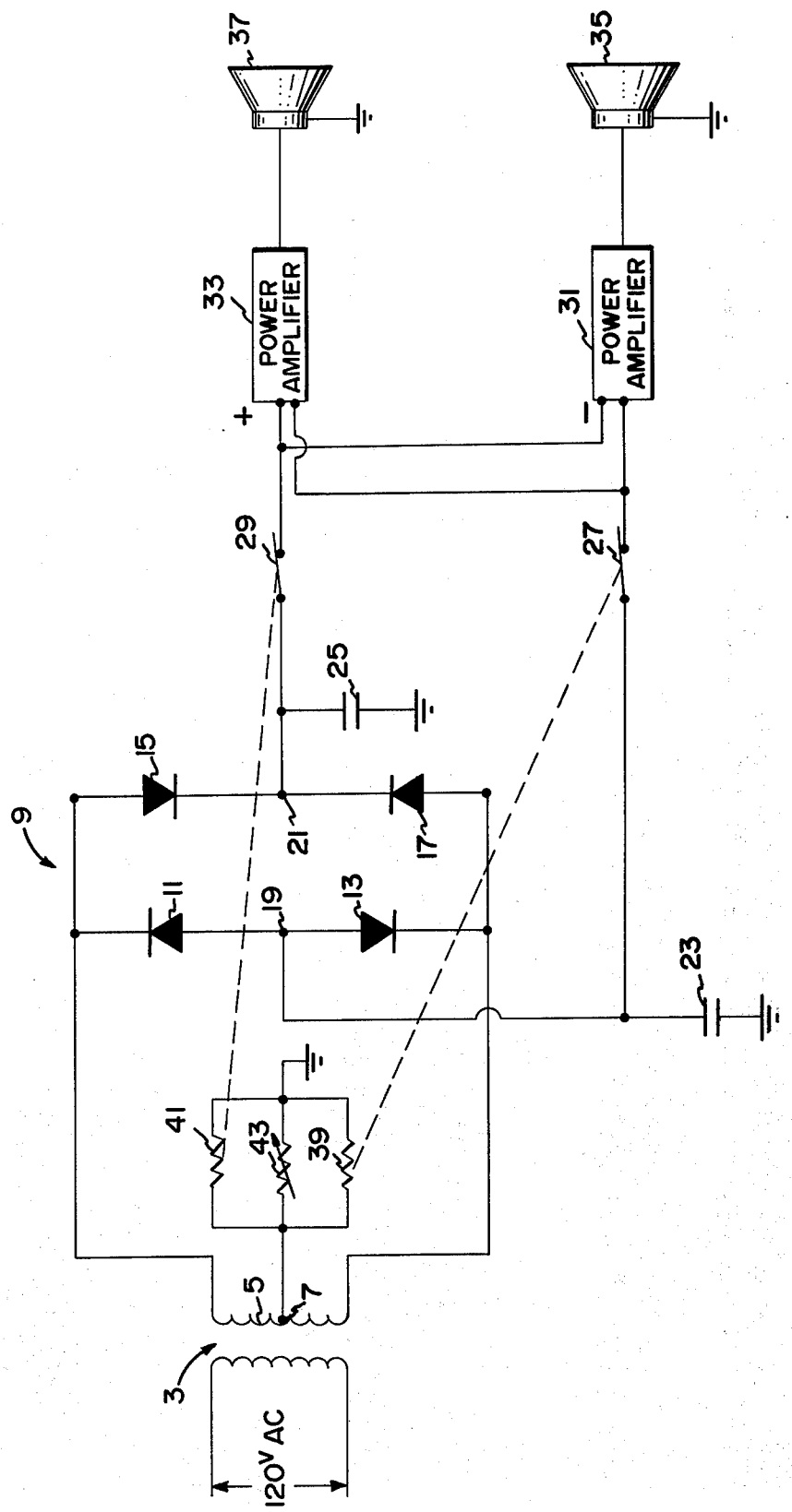

LOUDSPEAKER PROTECTION CIRCUIT

BACKGROUND OF THE INVENTION

Generally, a problem associated with signal receivers having one or more loudspeakers connected to direct-coupled audio power amplifiers is transistor failure in the amplifier. When a transistor in the amplifier fails, it is not uncommon for several amperes of DC current to appear at the loudspeaker. Such excessive current may be of an amount sufficient to burn out or cause a fire at the loudspeaker. Moreover, such currents usually have a deleterious effect on the ammplifier and may burn out several elements therein or even initiate a fire in the amplifier.

One of the common approaches to a solution of the above-described problem is the inclusion of circuit breakers in series with the leads of the loudspeaker. However, circuit breakers in series with the leads of the loudspeaker must be capable of carrying the AC current supplied to the loudspeakers and such currents can reach a figure of 2.5 to 4.5 amperes. Unfortunately, a DC current, derived from a fault condition, and of such an amount is more than enough to burn out any of the commonly employed loudspeakers.

Another known approach to the problem provides fuses in series with the speaker leads or in the B+ or power supply circuitry coupled to the power amplifiers. Unfortunately, fuses are relatively slow acting, suffer from the same limitation as circuit breakers, and are somewhat unpredictable in response. Moreover, fuses are unacceptable because they would not normally be considered a customer replaceable item.

Still another approach to the problem included a triac crowbar circuit in the loudspeaker leads. Also, circuitry with a plurality of transistors and a relay have been utilized to protect the loudspeaker system. However, the above-mentioned circuitry has been found to be relatively expensive of components and installation labor. Moreover, increased components tend to increase the complexity and reduce the reliability of most electrical circuitry.

OBJECTS AND SUMMARY OF THE INVENTION

An object of the present invention is to provide circuitry for enhanced protection of a loudspeaker and amplifier of a signal receiver. Another object of the invention is to reduce the probability of fires and loudspeaker destruction in a signal receiver. Still another object of the invention is to enhance the safety and reliability of a signal receiver with relatively simple, low cost circuitry. A further object of the invention is to utilize relatively inexpensive passive devices to improve the protection of a lousdpeaker and amplifier in a signal receiver.

These and other objects, advantages and capabilities are achieved in one aspect of the invention by a power amplifier stage directly coupled to a loudspeaker connected to a potential reference level with an AC potential source having a center-tap transformer shunted by a full-wave bridge rectifier wherein a thermal relay couples the bridge rectifier to the power amplifier stage through normally closed contacts and an impedance couples the center-tap of the transformer to circuit ground and in shunt with the thermal relay causes activation of the relay and disconnection of the potential source from the power amplifier stage upon increased current flow in the loudspeaker.

BRIEF DESCRIPTION OF THE DRAWINGS

The sole FIGURE is a block and schematic illustration of a preferred embodiment of the invention.

PREFERRED EMBODIMENT OF THE INVENTION

For a better understanding of the present invention, together with other and further objects, advantages and capabilities thereof, reference is made to the following disclosure and appended claims in conjunction with the accompanying drawing.

Referring to the drawing, an AC potential source includes a transformer 3 having a secondary winding 5 with a center-tap connected 7. The secondary winding 5 of the transformer 3 is shunted by a full-wave bridge rectifier circuit 9 including first and second pairs of oppositely-poled diodes, 11 and 13 and 15 and 17 respectively.

The full-wave bridge rectifier circuit 9 has a pair of DC output potential terminals, 19 and 21, each of which is coupled to an AC filter means in the form of a capacitor 23 and 25 respectively, connected to a potential reference level or circuit ground. Also, each of the DC output potential terminals 19 and 21 is connected to a normally closed contact member, 27 and 29 of a thermal relay means.

Each of the normally closed contact members 27 and 29 is connected to the power amplifier stages, 31 and 33, which are in turn connected to the loudspeakers 35 and 37. Each of the loudspeakers, 35 and 37, is directly connected to a potential reference level such as circuit ground in this example.

Also, each of the normally closed contact members 27 and 29 of the thermal relay means has associated with it a heater means, 39 and 41, coupled in parallel intermediate the center-tap 7 of the secondary winding 5 and a potential reference level or circuit ground. Moreover, an impedance, in the form of a resistor 43, shunts the heater means 39 and 41 and also couples the center-tap 7 of the secondary winding 5 of the transformer 3 to circuit ground.

As to operation, the AC potential source energizes the full-wave bridge rectifier circuit 9 to provide opposite polarity DC potentials at the DC output potential terminals 19 and 21. These DC potentials are filtered by the capacitors 23 and 25 to remove any AC potentials and applied via the normally closed contact members 27 and 29 of the thermal relay means to the power amplifier stages 31 and 33. Moreover, each of the power amplifier stages 31 and 33 is directly connected to a loudspeaker, 35 and 37, which is connected to circuit ground.

During normal operation with signals at frequencies above the power line frequency, very little current flows through the center-tap of the transformer. Should a fault develop in one of the power amplifier stages 31 and 33 or an increase in current flow occur at any one of the loudspeakers, 35 and 37, this current will also flow through the resistor 43. Thereupon, a potential will develop across the heater means, 39 and 41, of the thermal relay means to cause the closed contact members 27 and 29 to open. Thus, the open contact members 27 and 29 disconnect the power source from the power amplifier stages 31 and 33 and serve to protect the power amplifier stages 31 and 33 and the loudspeakers 35 and 37 from destruction, burn out, or fire development due to component failure.

It should perhaps be noted that the above-mentioned protection circuitry is not adapted to power amplifiers utilized in a bridge mode. In such instances, current from the oppositely-poled DC potentials applied to one of the power amplifier stages is dissipated in the opposite power amplifier stage whereupon no current flows through the resistor 43 to activate the thermal relay means.

Thus, there has been provided a unique and inexpensive power amplifier and loudspeaker protection system. The system utilizes a minimum number of inexpensive components which are readily available and easily installed. Also, the apparatus is "self-healing" in that the relay system re-sets itself without any adjustment by the customer. However, should a serious fault develop, the loudspeaker and power amplifiers are protected and continue to be rendered inoperative without damage to the loudspeakers since once the relay has been heated it will open very quickly upon re-application of an overload.

While there has been shown and described what is at present considered the preferred embodiment of the invention, it will be obvious to those skilled in the art that various changes and modifications may be made therein without departing from the invention as defined by the appended claims.

What is claimed is:

1. In a signal receiver having a plurality of power amplifier stages each directly coupled to a loudspeaker connected to a potential reference level, a power amplifier and loudspeaker protection circuit comprising:
    an AC potential source including a center-tap transformer;
    a full-wave bridge rectifier shunting said transformer and having a pair of DC output potential terminals;
    AC filter means coupling each one of said pair of DC output potential terminals to a potential reference level;
    thermal relay means associated with each one of said DC output potential terminals, each of said thermal relay means including a heater coupled to said center-tap of said transformer and to a potential reference level and a normally closed contact associated with said heater and coupling said DC output potential terminals to said power amplifier stages; and
    impedance means coupling said center-tap of said transformer to said potential reference level and shunting said heater of said relay means for developing a potential causing activation of said relay means to disconnect said potenital source from said power amplifier stages in response to an increased current flow in one of said loudspeakers.

2. The power amplifier and loudspeaker protection circuit of claim 1 wherein said AC filter means is in the form of a capacitor coupling each one of said DC output potential terminals to circuit ground.

3. The power amplifier and loudspeaker protection circuit of claim 1 wherein said impedance means is in the form of a resistor coupling said center-tap transformer to a potential reference level.

4. The power amplifier and loudspeaker protection circuit of claim 1 wherein said impedance means is in the form of an adjustable resistor to provide sensitivity adjustment of said relay means in accordance with DC current flow in said loudspeaker.

5. In a signal receiver having an AC potential source including a center-tap transformer shunted by a full-wave bridge rectifier to provide a pair of DC output potential terminals and a plurality of power amplifier stages each directly coupled to a loudspeaker connected to a potential reference level, a power amplifier and loudspeaker protection circuit comprising:
    thermal relay means associated with each one of said DC output potential terminals, each of said thermal relay means including a normally closed contact coupling said DC output potential terminals to said power amplifier stages and a heater coupled to said center-tap of said transformer and to said potential reference level; and
    impedance means coupling said center-tap of said transformer to said potential reference level for developing a potential to effect activation of said relay means and disconnection of said power amplifier from said DC output potential terminals upon increased current flow in said loudspeaker.

6. The power amplifier and loudspeaker protection circuit of claim 5 including an AC filter means coupling each one of said DC output potential terminals to a potential reference level.

7. The power amplifier and loudspeaker protection circuit of claim 5 wherein said impedance means is in the form of a resistor connecting said center-tap of said transformer to a potential reference level.

* * * * *